United States Patent
Kanter et al.

(10) Patent No.: US 12,283,972 B2
(45) Date of Patent: Apr. 22, 2025

(54) METHOD AND SYSTEM FOR ERROR CORRECTION IN MEMORY DEVICES USING IRREGULAR ERROR CORRECTION CODE COMPONENTS

(71) Applicant: Kioxia Corporation, Tokyo (JP)

(72) Inventors: Ofir Kanter, Tel Aviv (IL); Avi Steiner, Tel Aviv (IL); Amir Nassie, Tel Aviv (IL); Hanan Weingarten, Tel Aviv (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/341,041

(22) Filed: Jun. 26, 2023

(65) Prior Publication Data
US 2023/0336190 A1    Oct. 19, 2023

Related U.S. Application Data

(62) Division of application No. 17/401,215, filed on Aug. 12, 2021, now Pat. No. 11,689,219.

(51) Int. Cl.
*H03M 13/11* (2006.01)
*H03M 13/29* (2006.01)

(52) U.S. Cl.
CPC ..... *H03M 13/118* (2013.01); *H03M 13/2909* (2013.01)

(58) Field of Classification Search
CPC ........... H03M 13/118; H03M 13/2909; H03M 13/27; H03M 13/2927; H03M 13/6516;
(Continued)

(56) References Cited

U.S. PATENT DOCUMENTS

| 2010/0241933 A1* | 9/2010 | Latremouille | H04L 1/0052 714/E11.032 |
| 2013/0024743 A1 | 1/2013 | Sharon et al. | |

(Continued)

OTHER PUBLICATIONS

Non-Final Office Action in U.S. Appl. No. 17/401,215 dated Oct. 7, 2022.
(Continued)

*Primary Examiner* — Thien Nguyen
(74) *Attorney, Agent, or Firm* — Foley & Lardner LLP

(57) ABSTRACT

Example implementations include a method of optimizing irregular error correction code components in memory devices, a method including obtaining one or more code rate parameters including a payload size parameter, a group size parameter, and a redundancy parameter generating a first number of first code component blocks associated with a first error correction capability, and a second number of code component blocks associated with a second error correction capability aligning the first code component blocks and the second code component blocks to the group size parameter aligning the first code component blocks and the second code component blocks to a code component length constraint, and generating, in accordance with an optimization metric based on the first error correction capability and the second error correction capability, first optimized code components based on the first code component blocks and second optimized code components based on the second code component blocks.

19 Claims, 10 Drawing Sheets

(58) Field of Classification Search
CPC ......... H03M 13/2906; H03M 13/1515; H03M 13/353; H03M 13/152
See application file for complete search history.

(56) References Cited

U.S. PATENT DOCUMENTS

| | | | |
|---|---|---|---|
| 2014/0053042 A1 | 2/2014 | Wang et al. | |
| 2019/0341937 A1* | 11/2019 | Yang | H03M 13/159 |
| 2020/0293400 A1* | 9/2020 | Steiner | G11C 29/52 |

OTHER PUBLICATIONS

Notice of Allowance in U.S. Appl. No. 17/401,215 dated Feb. 13, 2023.

* cited by examiner

METHOD AND SYSTEM FOR ERROR CORRECTION IN MEMORY DEVICES USING IRREGULAR ERROR CORRECTION CODE COMPONENTS

CROSS-REFERENCE TO RELATED PATENT APPLICATIONS

This application is a divisional application of U.S. patent application Ser. No. 17/401,215, filed Aug. 12, 2021 (now U.S. Pat. No. 11,689,219), which is incorporated herein by reference in its entirety.

TECHNICAL FIELD

The present implementations relate generally to error correction in memory devices, and more particularly to correcting irregular error correction code components.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP). Other causes for impairment can lead to complete erasure of a physical page, row, or block in a NAND flash memory device, in what is known as a block becoming a "bad" block and is no-longer readable. If impairments are not detected during programming, a encoding (e.g., a RAID encoding) may be needed to allow recovery of non-readable areas on the NAND flash memory device. Maximizing error correction capability is thus desired, to maintain reliable operation of increasingly complex memory devices having increasing data storage capacities.

SUMMARY

Example implementations are advantageously directed to methods and systems for obtaining higher endurance and higher average read performance for NAND Flash devices. A structure of error correcting code (ECC) in accordance with present implementations can provide a higher error correction capability. As one example, the structure can be based on, but is not limited to, half folded product code (HFPC) supporting irregularity with respect to error correction code components. Irregular HFPC can therefore provide advantageously higher error correction capability in high code rates as required for NAND Flash memories.

In accordance with example implementations, a technical solution of high error correction capability for nonvolatile memory devices can be achieved. Specifically, implementations including irregular HFPC can achieve higher flexibility in error correction code structures, can thus support a wide range of code rates, and can support multiple levels of error correction capability concurrently while controlling an error floor rate within an optimization threshold. The optimization threshold can be specific to a particular memory device structure, a particular memory device operation mode, or any combination thereof, to result in a flexible error correction code structure optimized for maximum error correction capability with respect to a particular memory device. Thus, a technological solution for correcting irregular error correction code components is provided.

Example implementations include a method of optimizing irregular error correction code components in memory devices, a method including obtaining one or more code rate parameters including a payload size parameter, a group size parameter, and a redundancy parameter generating a first number of first code component blocks associated with a first error correction capability, and a second number of code component blocks associated with a second error correction capability aligning the first code component blocks and the second code component blocks to the group size parameter aligning the first code component blocks and the second code component blocks to a code component length constraint, and generating, in accordance with an optimization metric based on the first error correction capability and the second error correction capability, first optimized code components based on the first code component blocks and second optimized code components based on the second code component blocks.

Example implementations also include a method further including modifying a memory device based on the first optimized code components and the second optimized code components.

Example implementations also include a method where the aligning the first code component blocks and the second code component blocks to the group size parameter includes calculating an alignment of the first code component blocks and the second code component blocks to the group size parameter.

Example implementations also include a method where the calculating the alignment of the first code component blocks and the second code component blocks to the group size parameter includes calculating a modulus of a sum of the first number of the first code component blocks and the second number of the second code component blocks to the group size parameter.

Example implementations also include a method where the aligning the first code component blocks and the second code component blocks to the group size parameter further includes modifying, in response to a determination that the alignment of first code component blocks and second code component blocks to the group size parameter does not satisfy an alignment threshold, the first number of code component blocks and the second number of code component blocks, and calculating an alignment of the first modified code component blocks and the second modified code component blocks to the group size parameter.

Example implementations also include a method where the modifying the first number of code component blocks and the second number of code component blocks includes decreasing the first number of code component blocks, and increasing the second number of code component blocks.

Example implementations also include a method where the aligning the first code component blocks and the second code component blocks to the code component length constraint includes calculating an aggregate code component block length based on the first number of the first code component blocks and the second number of the second code component blocks.

Example implementations also include a method where the aggregate code component block length includes an average code component block length based on the first number of the first code component blocks and the second number of the second code component blocks.

Example implementations also include a method where the generating the first optimized code components and the second optimized code components includes generating first code components based on the first code component blocks and corresponding to payload bits of a memory device, generating second code components based on the second code component blocks and corresponding to the payload bits of the memory device, and calculating a capability-to-error optimization metric based on the first code components and the second code components.

Example implementations also include a method where the generating the first optimized code components and the second optimized code components further includes modifying, in accordance with a determination that the capability-to-error optimization metric does not satisfy an optimization threshold, the first number of code component blocks and the second number of code component blocks.

Example implementations include a method where the modifying the first number of code component blocks and the second number of code component blocks includes decreasing the first number of code component blocks, and increasing the second number of code component blocks.

Example implementations also include a method where the first code component blocks and the second code component blocks include half-folded product code (HFPC) code component blocks.

Example implementations also include a method where the first error correction capability includes a three bit error correction capability.

Example implementations also include a method where the second error correction capability includes a two bit error correction capability.

Example implementations also include an error correction system, including a first syndrome calculation cell operable to receive a first code component input and to generate a first error correction syndrome output corresponding to the first code component input, and a second syndrome calculation cell operable to receive the first code component input and to generate a second error correction syndrome output corresponding to the first code component input.

Example implementations also include a third syndrome calculation cell operable to receive a second code component input and to generate a third error correction syndrome output corresponding to a second code component input.

Example implementations also include an error correction system where the first syndrome calculation cell is operable to receive the second code component input and to generate a fourth error correction syndrome output corresponding to the first code component input, and the second syndrome calculation cell is operable to receive the second code component input and to generate a fifth error correction syndrome output corresponding to the second code component input.

Example implementations also include an error correction system where the first syndrome calculation cell includes a parity block operable to generate an error correction output in accordance with a parity check matrix corresponding to the code rate parameters.

Example implementations also include a non-transitory computer-readable media storing computer-readable instructions, such that when executed, causes a processing circuit to optimize irregular error correction code components corresponding to a non-volatile storage device by obtaining one or more code rate parameters including a payload size parameter, a group size parameter, and a redundancy parameter generating a first number of first code component blocks associated with a first error correction capability, and a second number of code component blocks associated with a second error correction capability aligning the first code component blocks and the second code component blocks to the group size parameter aligning the first code component blocks and the second code component blocks to a code component length constraint, and generating, in accordance with an optimization metric based on the first error correction capability and the second error correction capability, first optimized code components based on the first code component blocks and second optimized code components based on the second code component blocks.

Example implementations also include a non-transitory computer-readable media where the processing circuit is further configured to optimize irregular error correction code components corresponding to the non-volatile storage device by modifying the non-volatile storage device based on the first optimized code components and the second optimized code components.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
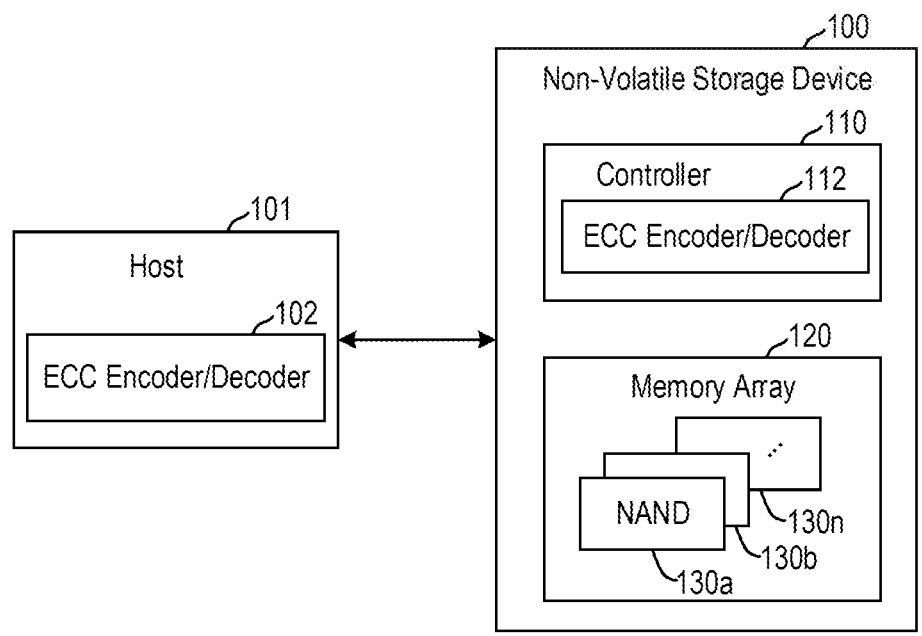
FIG. 1 illustrates an example system including a non-volatile storage device and a host, in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

In some arrangements, a code construction as described herein is based on simple component codes (such as but not limited to, Bose-Chaudhuri-Hocquenghem (BCH) components) which can be implemented efficiently. The component codes implement iterative decoding. Therefore, the code construction has a more cost-effective implementation as compared to conventional codes (e.g., the LDPC codes) that have complex and costly implementations. This allows the code structure to be suitable for storage applications for flash memory devices (e.g., NAND flash memory devices and controllers thereof).

In some arrangements, the ECC structure uses multi-dimensional encoding. In multi-dimensional encoding, a stream of data is passed through a set of multiple component encoders (implemented or otherwise included by a controller) which together encode the full payload into a single codeword. BCH encoding can be performed by passing systematic data of the code through a shift register of a controller. Therefore, the systematic data can simply pass through the component encoders of the controller without being modified while the shift-register advances. After the systematic data being completely passed through the shift-register, the content of the shift register is the redundancy of the code and is appended to the data stream. The same characteristics are applicable to all component encoders in all dimensions. Multi-dimensional encoding can be obtained with product codes or symmetric product codes and may provide improved capabilities. Such structures create a product of component codes to obtain a full codeword.

Present implementations include one or more technological solutions, by at least including irregular error correction code structures, to the technological problem of limited reliability and speed of error correction in memory devices.

As one example, present implementations can advantageously support a wide range of code rates. A code rate can be defined by a ratio of information content (referred to as a "payload") of a codeword to an overall size of the codeword. For example, for a code that contains k bits and r redundancy bits, the code rate $R_c$ is defined by $$R_c = \frac{k}{k+r}.$$

As another example, present implementations can advantageously obtain high error correction capabilities for hard decoding and soft decoding. As another example, present implementations can advantageously allow high throughput encoding/decoding, at low implementation complexity. As another example, present implementations can advantageously allow efficient hardware implementation. As another example, irregular error correction code structures of present implementations can advantageously can support a wide range of code rates. As another example, irregular error correction code structures present implementations can advantageously be configured to support a specific code rate among a plurality of permissible code rates. As another example, irregular error correction code structures of present implementations can advantageously flexibility enable different code constructions for a specific code rate, to advantageously achieve error correction capability optimization according to particular device and application requirements. As another example, present implementations can advantageously enable low complexity implementation and gate-count reduction, reducing physical size and cost of memory devices while increasing reliability and speed in error correction.

FIG. 1 illustrates an example system including a non-volatile storage device and a host, in accordance with present implementations. To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), ECC capabilities, and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some arrangements, one of the ECC encoder/decoder 102 or the ECC encoder/decoder 112 employs the hard decoding methods described herein. In some implementations, the ECC encoders of the ECC encoder/decoder 102 are configured to encode data (e.g. input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short codewords. In some arrangements, the HFPC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by:

$$t = (D_{min} - 1)/2 \qquad (1),$$

where the $D_{min}$, of a linear block code is defined as the smallest Hamming distance between any pair of code vectors in the code. The number of redundancy bits r can be represented by:

$$r = Q \cdot (D_{min} - 1)/2 \qquad (2),$$

where Q is a Galois field parameter for the BCH component code defined over $GF(2^Q)$. Given a code rate R and payload length K bits, a number of component codes needed can be determined by:

$$n = \left\lceil K \cdot \frac{1-R}{r \cdot R} \right\rceil; \qquad (3)$$

or $$n = \left\lceil 2K \cdot \frac{1-R}{Q \cdot (D_{min} - 1) \cdot R} \right\rceil. \qquad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
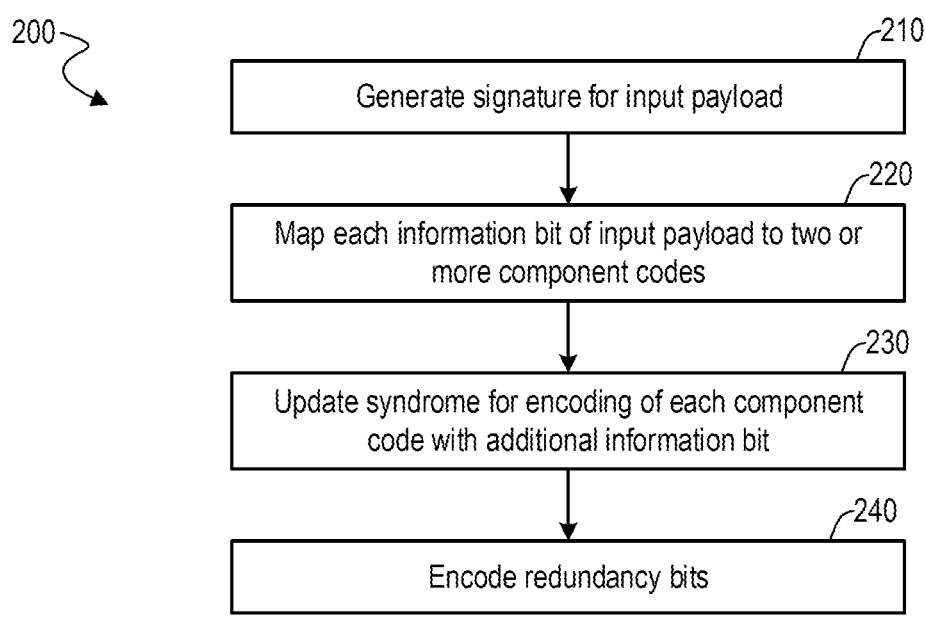
FIG. 2 illustrates a first example method of optimizing irregular error correction code components in memory devices, in accordance with present implementations.

FIG. 2 illustrates a first example method of optimizing irregular error correction code components in memory devices, in accordance with present implementations. In some implementations, at least one of the non-volatile storage device 100 and the host 101 performs method 200 according to present implementations. In some implementations, the method 200 begins at 210.

At 210, the example system obtains one or more code rate parameters. Code rate parameters can include one or more of a code rate, an error correction capability t, a frame size in bits or bytes, a payload size in bits or bytes, a redundancy size in bits or bytes, and a group size in bits. The code rate parameters can collectively govern an error correction code structure for one or more of hardware decoding and software decoding of errors in memory devices. The method 200 then continues to 220.

At 220, the example system generates at least one of a 3-bit code component block and a 2-bit code component block. In accordance with present implementations, an error correction code structure can include both 3-bit code components and 2-bit code components. The method 200 then continues to 230.

At 230, the example system aligns the at least one generated code component block to a group size parameter. In accordance with present implementations, the number of 3-bit code components and the number of 2-bit code components can be optimized to fit a component code group size constraint. As one example, a group size can be 8 bits. It is to be understood that the group size is not limited to 8 bits, and can be any number of bits. The method 200 then continues to 240.

At 240, the example system aligns the at least one generated code component block to a code component length constraint. In accordance with present implementations, the code components can be aligned to the component length constraint to validate whether the code components are valid and can thus accurately perform an error correction operation in accordance with the code rate selected. The code component length constraint can be iteratively validated, and the number of 3-bit components and the number of 2-bit code components can be modified iteratively to satisfy the constraint. In some implementations, the component code length constraint is a code rate constraint of 2Q, where Q is the code rate, and is compared to an arithmetic mean of code lengths of both of the 3-bit code components and the 2-bit code components. In some implementations, the arithmetic mean must be less than the code length constraint to be valid. The method 200 then continues to 250.

At 250, the example system generates one or more optimized 3-bit code components and 2-bit code components from the code component blocks. As one example, an initial number of code components can be set and iteratively modified toward a number optimized to maximize error correction capability, minimize an error floor, or both. It is to be understood that the initial number of 3-bit code components can be maximized and iteratively reduced while increasing the number of 2-bit code components. It is to be further understood that the initial number of 2-bit code components can be maximized and iteratively reduced while increasing the number of 3-bit code components. In some implementations, the method 200 ends at 250.

Figure 3:
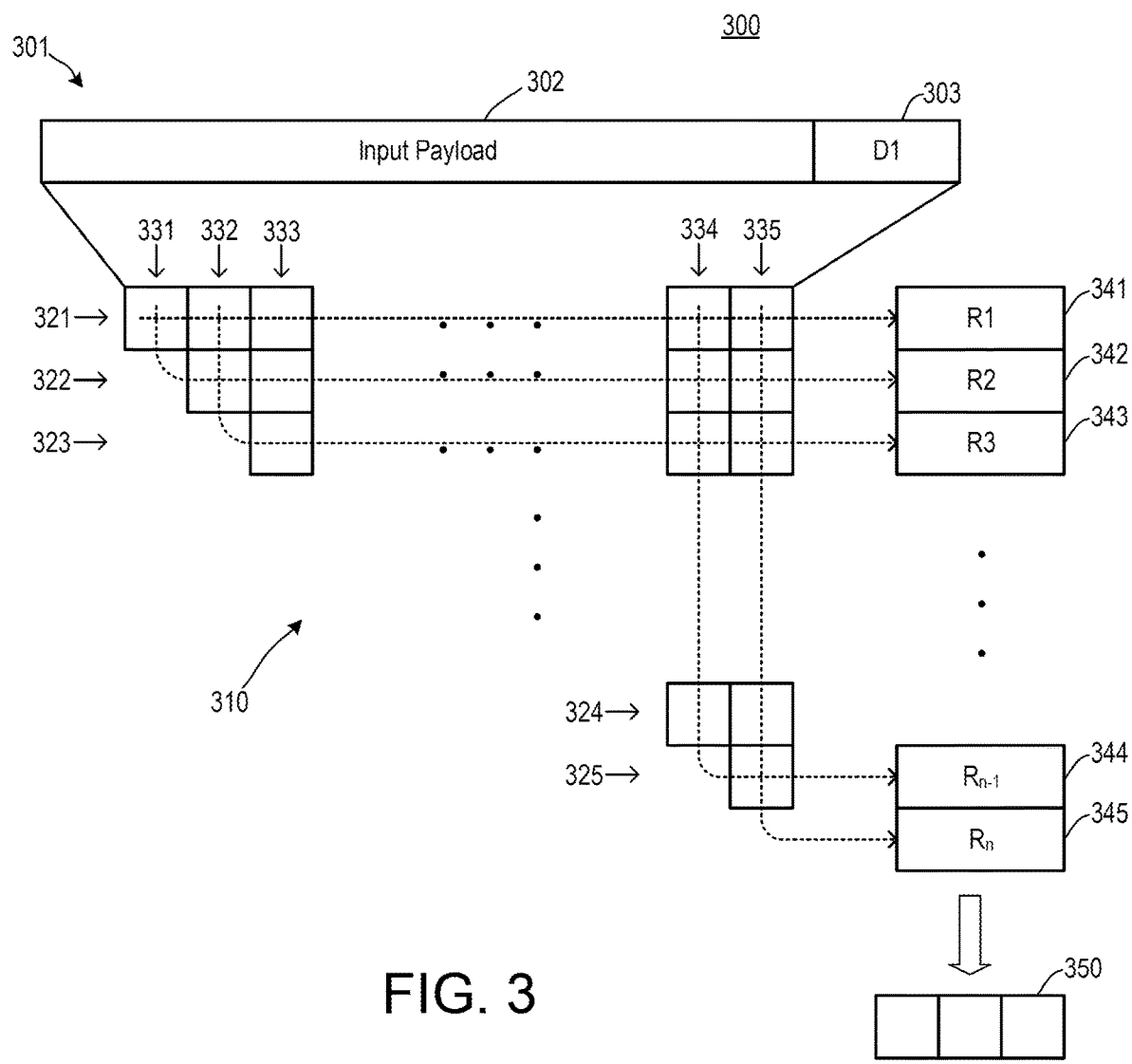
FIG. 3 illustrates an example memory device error correction mapping in an error process using a Half Folded-Product Code (HFPC) structure, in accordance with present implementations.

FIG. 3 illustrates an example memory device error correction mapping in an error process using a Half Folded-Product Code (HFPC) structure, in accordance with present implementations. FIG. 3 is a diagram illustrating a mapping 300 in an encoding process using a HFPC structure according to various implementations. The controller 110 (e.g., one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. In some examples, the input payload 302 includes information bits and redundancy bits introduced by the host 101 for RAID or erasure encoding (e.g. by the one or more ECC encoders of the ECC encoder/decoder 102). As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits.

In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one arrangement, the mapping is a one to one mapping, where each bit of the input bits 301 is mapped to one bit of the pseudo triangular matrix 310 and the total number of bits in the pseudo triangular matrix 310 is equal to the number of input bits 301. In another arrangement, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 into a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn−1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIGS. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding).

The redundancy bits R1 341-Rn-m 345 generated from the HFPC encoding process described with respect to FIG. 3 can be encoded by another, separate set of component codes used to encode all or a subset of these redundancy bits by another set of component codes. This forms a folded product code encoding over the redundancy bits R1 341-Rn-m 345, which, together with the information bits encoding, results in a low complexity encoding process.

As shown, the bits for each component code depend on the bits for another component code during decoding in the ECC structure corresponding to the mapping 300.

For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes.

In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 4:
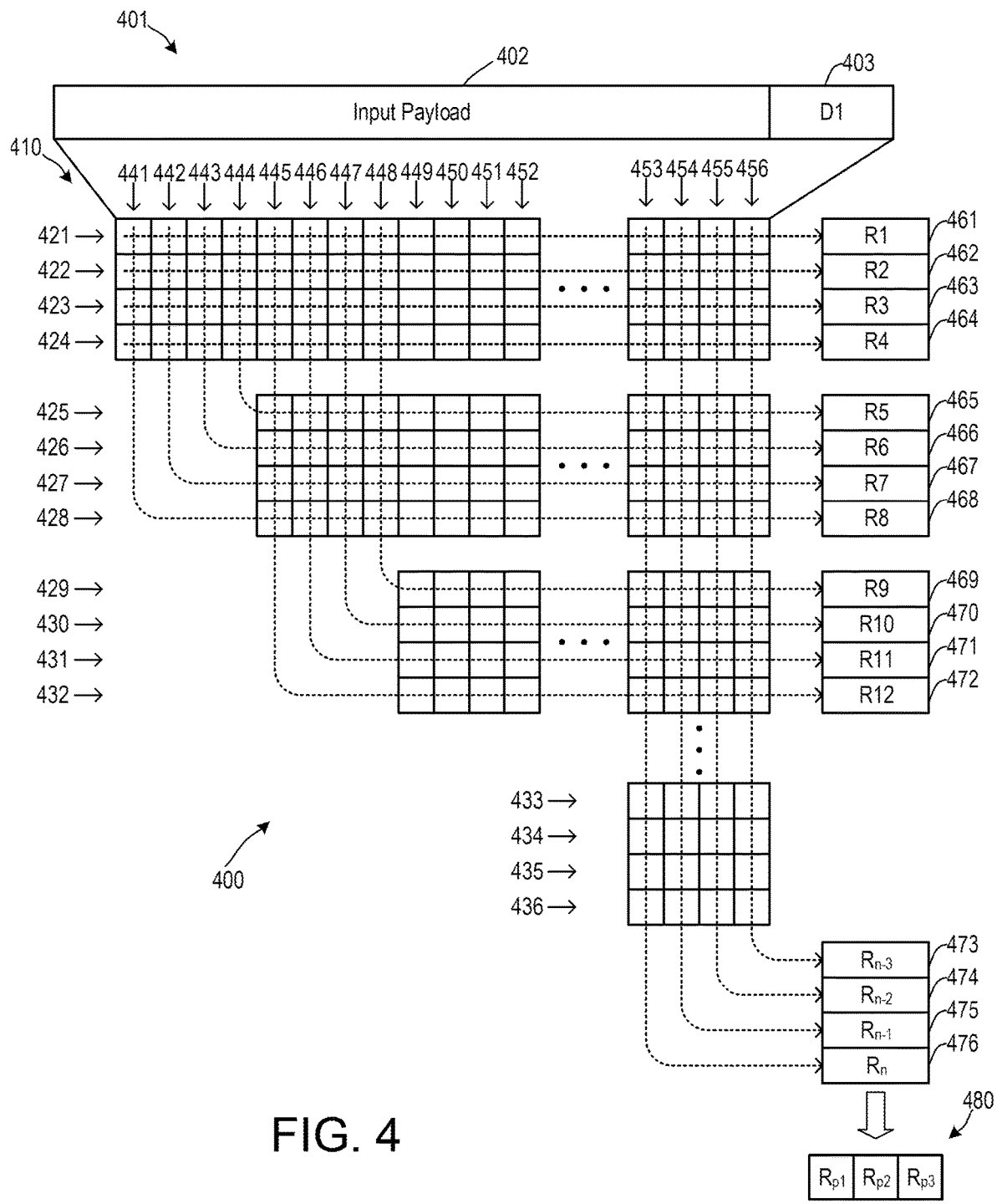
FIG. 4 illustrates an example memory device error correction mapping in an encoding process using a group HFPC structure, in accordance with present implementations.

FIG. 4 illustrates an example memory device error correction mapping in an encoding process using a group HFPC structure, in accordance with present implementations. FIG. 4 is a diagram illustrating a mapping 400 in an encoding process using a group HFPC structure according to various implementations. Referring to FIGS. 1-4, the mapping 400 corresponds to the group HFPC encoding scheme and is an example implementation of block 220. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 401 into a form of a pseudo triangular matrix 410. The input bits 401 includes input payload 402 and signature bit(s) D1 403 in some examples. The input payload 402 includes the information bits. As described, an example of D1 403 is the extra CRC bits (outer paritybits). The mapping from the input bits 401 to the pseudo triangular matrix 410 is maintained by the controller 110.

As shown, the pseudo triangular matrix 410 has an upper triangular form, which has rows 421-436 (with rows between rows 432 and 433 omitted for clarity) and columns 441-456 (with columns between columns 452 and 453 omitted for clarity). The pseudo triangular matrix 410 is shown to have multiple blocks. Each block in the pseudo triangular matrix 410 includes or otherwise represents two or more bits of the input bits 401. The number of input bits per each block can be predetermined and equal for all the blocks of the pseudo triangular matrix 410. The disclosed implementations allow intersection of two or more common bits for any pair of component codes.

In some implementations, the input bits 401 are mapped to blocks in the pseudo triangular matrix 410 consecutively (by any suitable order). For example, the rows 421-436, in that order or in a reverse order, can be filled by the input bits 401 consecutively block-by-block, from the left-most block of a row to a right-most block of a row, or vice versa. In another example, the columns 441-456, in that order or in a reverse order, can be filled by the input bits 401 consecutively block-by-block, from the top-most block of a column to a bottom-most block of a row, or vice versa. In some implementations, the input bits 401 are mapped to the pseudo triangular matrix 410 pseudo-randomly. In other implementations, the input bits 401 can be mapped to the pseudo triangular matrix 410 using another suitable mapping mechanism.

The blocks, rows, and columns in the pseudo triangular matrix 410 can be grouped together. For example, the pseudo triangular matrix 410 includes a first group of columns 441-444, a second group of columns 445-448, a third group of columns 449-452, . . . , and another group of columns 453-456. The pseudo triangular matrix 410 includes a first group of rows 421-424, a second group of rows 425-428, a third group of rows 429-432, . . . , and another group of rows 433-436. Thus, the HFPC structure is divided into groups of 4 component codes. Every 4 component codes are encoded according to HFPC guidelines. Although 4 component code groups (e.g., 4 rows/columns) are shown in FIG. 4, any number (e.g., 2, 3, 6, 8, 10, 12, 16, and so on) of component codes can be grouped together.

As shown, the upper triangular form has a same number of columns and a same number of rows. The rows (e.g., the rows 421-424) or columns (e.g., the columns 441-444) in a same component code group have a same number of blocks and therefore have a same number of bits. In the upper triangular form, the rows 421-424 contain the most bits out of all the rows in the pseudo triangular matrix 410. Each of the rows 425-428 has one less group of blocks (4 blocks, corresponding to the group of columns 441-444) than any of the rows 421-424. Each of the rows 429-432 has one less group of blocks (4 blocks, corresponding to the group of columns 445-448) than any of the rows 425-428, and so on. Each of the rows 433-436, being the lowest row, has a group of blocks (e.g., 4 blocks). In other words, any row in the pseudo triangular matrix 410 (except for the rows 421-424) has 4 blocks less than a row of a group immediately above. Similarly, in the upper triangular form, each of the columns 441-444, being one of the left-most columns, has a group of blocks (e.g., 4 blocks). Each of the columns 445-448 has one more group of blocks (4 blocks, corresponding to the group of rows 425-428) than any of the columns 441-444. Each of the columns 449-452 has one more group of blocks (4 blocks, corresponding to the group of rows 429-432) than any of the columns 445-448, and so on. Each of the columns 453-456, being the right-most columns, has the most number of blocks. In other words, any column in the pseudo triangular matrix 410 (except for the columns 453-456) has 4 blocks less than a column of a group immediately to the right.

Organizing or mapping the input bits 401 in the upper triangular form of the pseudo triangular matrix 410 allows every component code to be associated with bits in a row and a column that have the same size or nearly the same size in the manner described. The component codes within a same group encode separate sets of the input bits 401 and are independent of each other.

R1 461-R4 464 are redundancy bits determined based on a same group of component codes. R1 461 represents redundancy bits corresponding to a first component code and are obtained by encoding (e.g., folded component encoding) the input bits 401 in a first row (e.g., the bits in the row 421). R2 462, R3 463, and R4 464 represent redundancy bits corresponding to additional component codes and are obtained by encoding (e.g., folded component encoding) the input bits 401 in the bits in the rows 422, 423, and 423, respectively. The bits used to determine each of R1 461-R4 464 do not overlap, and thus R1 461-R4 464 are independently determined.

R5 465, R6 466, R7 467, and R8 468 represent redundancy bits corresponding to additional component codes and are obtained by encoding (e.g., folded component encoding) the input bits 401 in the bits in the column 444 and row 425, in the column 443 and row 426, in the column 442 and row 427, and in the column 441 and row 428, respectively. The bits used to determine each of R5 465-R8 468 do not overlap, and thus R5 465-R8 468 are independently determined.

R9 469, R10 470, R11 471, and R12 472 represent redundancy bits corresponding to additional component codes and are obtained by encoding (e.g., folded component encoding) the input bits 401 in the bits in the column 448 and row 429, in the column 447 and row 430, in the column 446 and row 431, and in the column 445 and row 432, respectively. The bits used to determine each of R9 469-R12 472 do not overlap, and thus R9 469-R12 472 are independently determined.

This process continues until Rn-3 473, Rn-2 474, Rn-1 475, and Rn 476 are determined. Rn-3 473, Rn-2 474, Rn-1 475, and Rn 476 represent redundancy bits corresponding to additional component codes and are obtained by encoding (e.g., folded component encoding) the input bits 401 in the bits in the column 456, in the column 455, in the column 454, and in the column 453, respectively. The bits used to determine each of Rn-3 473, Rn-2 474, Rn-1 475, and Rn 476 do not overlap, and thus Rn-3 473, Rn-2 474, Rn-1 475, and Rn 476 are independently determined. An example of the folded component encoding is folded BCH encoding.

In the special case that the component codes are divided into two groups of independent component codes, the resulting coding scheme degenerates to a folded product code.

According to the mapping 400, the input bits 401 are mapped to the component codes of the ECC and are encoded as the mapped component codes. For example, the encoding process organizes or maps the input bits 401 in a matrix (e.g., a pseudo triangular matrix form), and performs folded BCH encoding for every component code. Each of the input bits 401 is encoded by two component codes of different component code groups. Thus, any component code intersects with all other component codes that are in the same group as the group to which that component code belongs. For component codes that encode the input bits 401, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 469 redundancy bits are also encoded by other component codes corresponding to R1 461-R8 468 and R11-Rn 476 that are not in the group in which the component code corresponding to R9 469 redundancy bits belongs. Each block of bits encoded by any of the component code (e.g., the component code corresponding to the R9 469) is encoded by that component code (e.g., the component code corresponding to the R9 469) and no more than another one of the component codes, hence in a non-overlapping manner. As such, every component code is mutually dependent on all other component codes that are not within the same group. The component codes together provide the encoding of each input bits 401 using two component codes.

In some implementations, parity bits can be generated via parity encoding. For example, folded parity encoding can be used to encode at least a portion of each of R1 461-Rn 476 into another component code (e.g., a folded product code 480, which is a set of packets). The folded product code 480 (e.g., having Rp1-Rp3) is the parity bits. This method of generating the parity bits can be efficient for obtaining simple hardware encoding implementations of HFPC, as the method can be iteratively decoded using various methods of hard or soft decoding.

Figure 5:
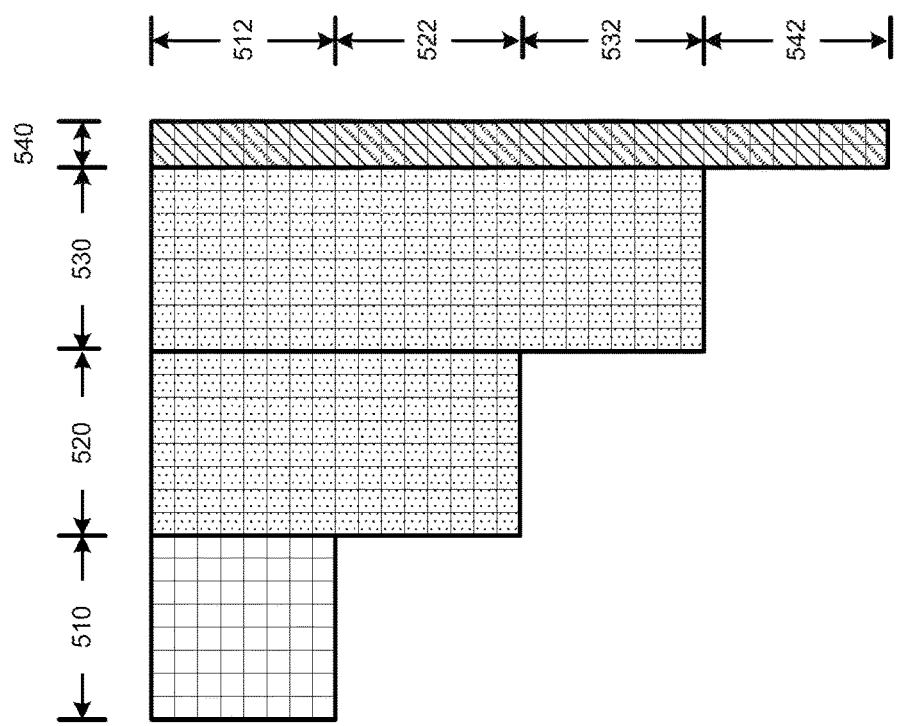
FIG. 5 illustrates an example memory device error correction mapping in an encoding process using an irregular group HFPC structure, in accordance with present implementations.

FIG. 5 illustrates an example memory device error correction mapping in an encoding process using an irregular group HFPC structure, in accordance with present implementations. As illustrated by way of example in FIG. 5, an example code structure 500 includes a first group 510, a first intersecting group 512, a second group 520, a second intersecting group 522, a third group 530, a third intersecting group 532, an irregular group 540, and an irregular intersecting group 512. In some implementations, a group size parameter may be restrictive with respect to available payload bits in an error correction code structure. The group size parameter defining the allocation of payload bits in the code structure may not allocate all payload bits in code structure, due to a lack of sufficient bits with respect to the number of bits required to construct a group in accordance with the code structure. Thus, in some implementations, the code structure may include 'wasted' bits that may not be allocated to a group, and thus may not be used for error correction, though they are available. Thus, allocation of the maximum number of payload bits to the code structure both maximizes error correction capability and minimizes unused or idle memory device hardware that can otherwise effectively be employed to perform error correction of the hardware device. Thus, but supporting an irregular group structure, these otherwise unused bits can be allocated to the code structure and overall error correction capability and error correction hardware utilization can both be maximized.

The example code structure 500 can include a code structure can have a group structure of eight components having eight bits each, with groups generated as multiplied of the base code structure as discussed above with respect to FIGS. 3 and 4. Thus, the first group 510, the second group 520, and the third group 530 can each include eight components. The code structure can also include the irregular group 540. The irregular group 540 includes two components, and can be smaller than a group size corresponding to the first, second, and third groups 510, 520 and 530. Correspondingly, the first intersecting group 512, the second intersecting group 522, the third intersecting group 532, and the irregular intersecting group 542 can each include eight components.

The example code structure 500 can demonstrate the error correction bits that can be utilized to maximize the error correction capability of a memory device. As one example, a group size can be 8 bits, a frame size can be 4,584 bytes, a payload size can be 4,128 bytes, and a redundancy can be 456 bytes, representing the number of bits in the frame not allocated to the payload. The group size of 8 bits can correspond to a byte length of 8 bits, and, correspondingly, a frame size can be 36,672 bits, the payload size can be 33,024 bits, and the redundancy can be 3,648 bits. In accordance with Expressions (1)-(4), where Q=10, t=3, for a group size of 8, the number of code components n can be 120, resulting in the number of unused or 'wasted' bits B being 48, as illustrated below in Expressions (5) an (6):

$$n = \left\lfloor \frac{3648}{(10)(3)} \right\rfloor = 120 \tag{5}$$

$$B = 3648 - (12)(10)(3) = 48 \tag{6}$$

Figure 6:
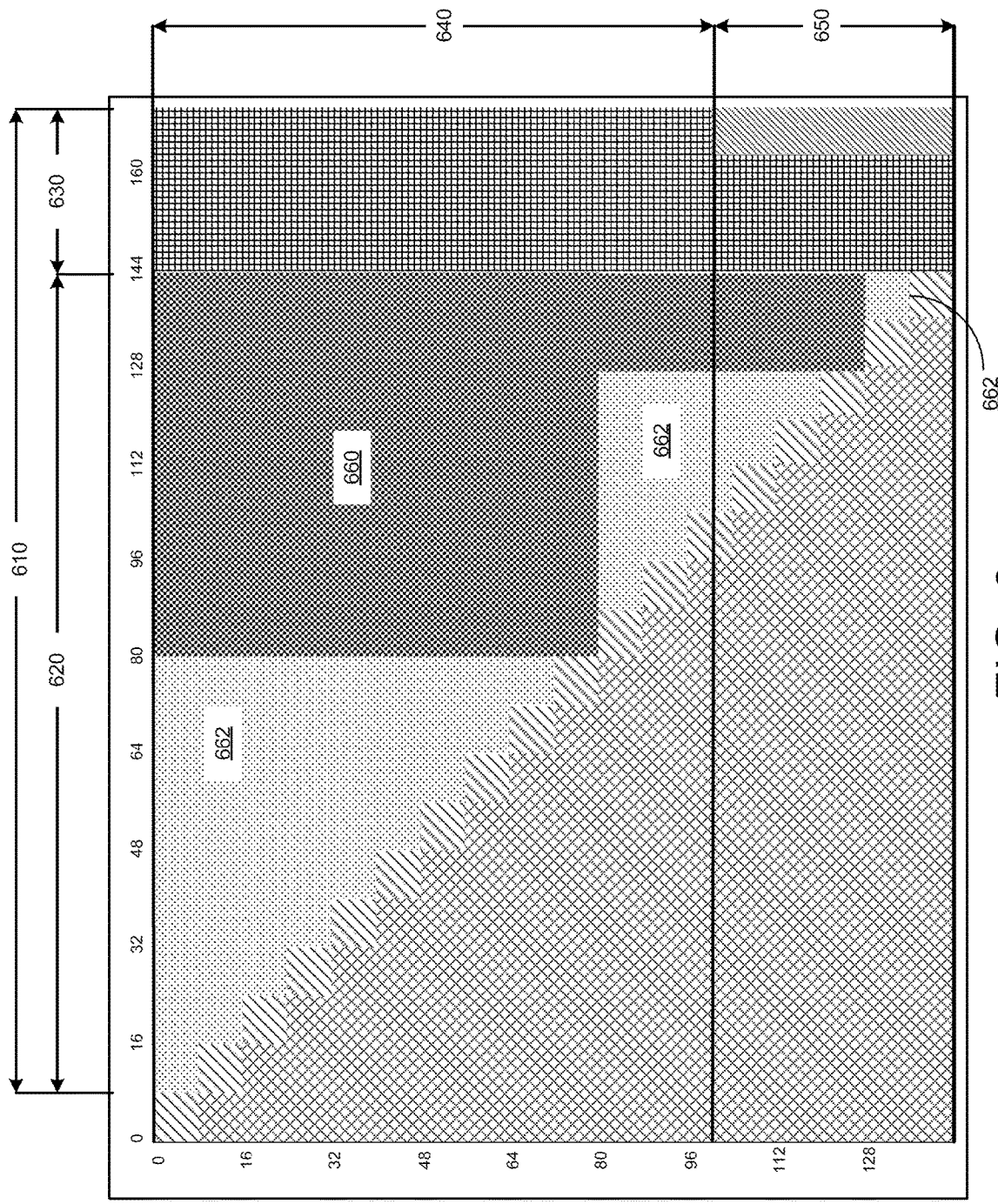
FIG. 6 illustrates a further example memory device error correction mapping in an encoding process using an irregular group HFPC structure, in accordance with present implementations.

FIG. 6 illustrates a further example memory device error correction mapping in an encoding process using an irregular group HFPC structure, in accordance with present implementations. As illustrated by way of example in FIG. 6, an example code structure 600 includes code components 610, payload bits 620, and redundancy bits 630, arranged into a 3-bit component code structure region 640 and a 2-bit component code structure region 650. An irregular code structure 600 can include various different code lengths corresponding to various different code components within the code structure. This variation in code lengths across the code structure provides varying levels of error protection of the bits within the codeword, and results in higher overall error correction capabilities under iterative decoding. In some implementations, the total number of components is not changed, and only packet length is changed in the irregular code structure 600.

The code components 610 each include corresponding bits among the payload bits 620 and corresponding bits among the redundancy bits 630, arranged into an example hybrid code structure including 3-bit and 2-bit error correction capable code components. The 3-bit code components in the 3-bit component code structure region 640 can correct 3 bit errors (t=3) and can have a redundancy size of 3Q. Correspondingly, the 2-bit code components in the 2-bit component code structure region 650 can correct 2 bit errors (t=2) and can have a redundancy size of 2Q. Thus, the 2-bit code components can have a higher false correction probability than the 3-bit code components, and can require fewer redundancy bits than the 3-bit code components. Thus, increasing the number of 2-bit code components and correspondingly decreasing the number of 3-bit code components at a particular code rate and for a particular structure can increase the total number of error correction code components used, and thus improve overall error correction capability. The code structure 600 can have parameters in accordance with Table 1 below.

TABLE 1

Parameter Values for Example Code Structure of FIG. 6

| Parameter | Value |
| --- | --- |
| Payload Size (Bytes) | 4128 |
| Frame Size (Bytes) | 4584 |
| Extension Bits | 0 |
| Number of 3-Bit Code Components (Q = 9) | 100 |
| Number of 2-Bit Code Components (Q = 9) | 44 |
| Total Number of Inner Components | 144 |
| Unused or 'Wasted' Redundancy Bits | 4 |
| Group Size | 18 |

It is to be understood that the number of 3-bit code components, the number of 2-bit code components, the total number of code components, and the code rate configurable and not limited to the values herein, and none are limited to the example implementations discussed herein. It is to be further understood that at least the t is configurable and not limited to the values herein, and can be optimized for a specific code rate. As one example, code structure can have Q=9 and t=2 and 3, corresponding to a hybrid code structure include 3-bit code components and 2-bit code components. Thus, in this example, the redundancy of 3-bit code components can be (3)(9)=27, and the redundancy of 2-bit code components can be (2)(9)=18. Thus, a code structure having 54 redundancy bits can include either three 2-bit code components or two 3-bit code components, resulting in 54 used or allocated redundancy bits.

The configurable allocation of 3-bit code components and 2-bit code components relative to each other in a code structure provides numerous advantages in error correction of memory devices. Many factors of operation of a memory device can be optimized in accordance with the variation in number of 3-bit code components and 2-bit code components, including but not limited to those advantages discussed below.

First, varying the number of 3-bit code components versus the number of 2-bit code components can allow configurable variability of code correction capability and an aggregate error floor associated with the error correction code structure. The number of 3-bit and 2-bit error code components can be varied to emphasize one or more of a particular target error correction capability and a particular target error floor. The particular target error correction capability and the particular target error floor can themselves vary to accommodate particular applications or structures of memory devices including the code structure. As one example, a higher number of total code components can improve error correction capability, while using more 2-bit code components, having a higher false-correction probability, can increase the error floor.

Second, different applications may have different requirements hard-decoding and soft-decoding capabilities. In some implementations, a higher number of total code components can improve soft-decoding capability, while using fewer 2-bit components with higher false-correction probability can reduce hard-decoding capability. As one example, parameter structures P1 and P2 as illustrated by way of example in Table 2 illustrate this variation in hardware-decoding and software decoding based on the variation in code structure parameters. Specifically, parameter structure P1 can have a higher hardware-decoding capability than P2, while parameter structure P2 can have a higher software-decoding capability than P1.

TABLE 2

Composition of Various Code Structures

| Parameters | P1 | P2 |
| --- | --- | --- |
| Payload Size (Bytes) | 3872 | 3872 |
| Frame Size (Bytes) | 4584 | 4584 |
| Code Rate | 0.845 | 0.845 |
| Number of 3-Bit Code Components (Q = 9) | 208 | 187 |
| Number of 2-Bit Code Components (Q = 9) | 0 | 29 |
| Total Number of Code Components | 208 | 216 |
| Unused or 'Wasted' Redundancy Bits | 16 | 3 |
| Group Size | 26 | 27 |
| 3-Bit Code Components vs. Total Number (%) | 0.0 | 13.4 |

Third, the hybrid code structure in accordance with present implementations demonstrates efficient utilization of redundancy bits at least with any group size greater than one. Increasing utilization of redundancy bits can correspondingly increase error correction capability. The total number of components can be aligned to group size in order to achieve efficient implementation. As a result of the alignment, a subset of redundancy bits are not used for encoding the code components. To utilize at least a portion of the subset of unused or wasted redundancy bits, the number of 3-bit code components and 2-bit code components can be balanced such that the total number of component will be aligned to group size, and reduce the number of "wasted" bits to a number smaller than Q.

Fourth, the hybrid code structure in accordance with present implementations accommodates includes of more code components in high code rates, without violating BCH maximal component length constraints, providing higher error correction capability. Increasing a number of code components by constructing code components in accordance with $GF(2^{Q-1})$ instead of $GF(2^Q)$ can require the use of fewer redundancy bits, and can thus increase the total number of code components. However, code component lengths may, in response, increase to longer than $2^{Q-1}$ the code construction, resulting in an invalid code structure and a failure of the error correction capability. In accordance with present implementations, the total number of components can be increased by using more 2-bit components, and thus reduce the average code component length and maintain validity of an error correction code structure in memory devices. As one example, Table 3 illustrates parameters of a first valid code structure C1 not including an irregular code structure, a second invalid code structure C2 not including an irregular code structure, and a third valid code structure C3 including an irregular code structure. In this example, each of C1, C2 and C3 include a payload size of 33.024 bits, a frame size of 36,672 bits, and a redundancy of 3,648 bits. Each case includes a particular code rate Q, error correction capability t, a number of code components n, a number of effective code components N aligned to an example group size of 8, and an average code component length

TABLE 3

Bit Usage Efficiency in Various Code Structures

| Case | Q | t | n | N | L |
|---|---|---|---|---|---|
| C1 | 10 | 3 | 121.6 | 120 | 580.4 |
| C2 | 9 | 3 | 135.1111 | 128 | 543 |
| C3 | 9 | 3 | 117 | 144 | 485.67 |
|  | 9 | 2 | 27 |  |  |

In Table 3, C1 corresponds to a code construction in which 48 redundancy bits cannot be used, because those bits cannot be captured within the group size of eight. The code structure C1 is valid, because the average code length of 580.4 is less than the code length limit of $2^{10}=1,024$. C2 corresponds to a code construction at a lower code rate to decrease the number of unused redundancy bits. The code structure C2 is invalid, because the average code length of 543 is greater than the code length limit of $2^9=512$. C3 corresponds to a valid code construction having fewer unused redundancy bits by including a hybrid code structure with 3-bit code components and 2-bit code components. In this example, only 3 redundancy bits cannot be used in the construction of C3. The average code component length is shorter than $2^9=512$. The code structure C3 is valid, because the average code length of 485.67 is less than the code length limit of $2^9$. It is to be understood that at least the code rate Q and the error correction capability t can vary and are not limited to the example discussed herein.

Figure 7A:
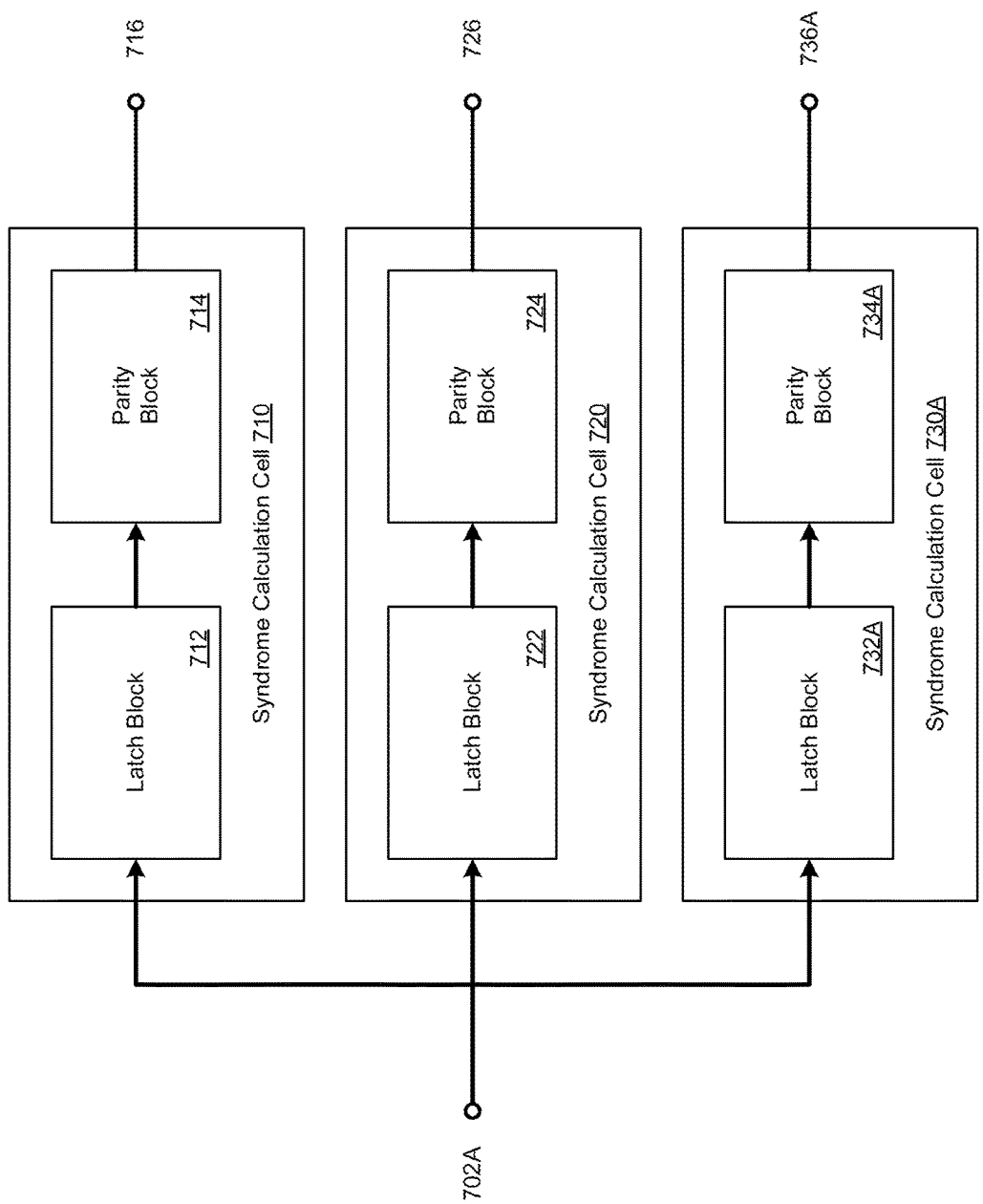
FIG. 7A illustrates an example memory device error correction syndrome generator in a first state corresponding to a first code component type, in accordance with present implementations.

FIG. 7A illustrates an example memory device error correction syndrome generator in a first state corresponding to a first code component type, in accordance with present implementations. As illustrated by way of example in FIG. 7A, an example syndrome generator in a first state 700A includes a syndrome input node receiving a first input 702A, a first syndrome calculation cell in an active state 710, a second syndrome calculation cell in an active state 720, and a third syndrome calculation cell in an active state 730A. It is to be understood that the syndrome generator can be incorporated into one or more of the nonvolatile storage device 100, the controller 112, the ECC encoder/decoder 112, the host 101, and the ECC encoder/decoder 102.

The syndrome input node 702A receiving the first input can receive an input corresponding to a 3-bit code component. The syndrome input node 702A can include one or more electrical, electronic, or like components to provide the first input to one or more of the syndrome calculation cells 710, 720 and 730A. In some implementations, the syndrome input node 702A includes one or more digital, analog, or like communication channels, lines, traces, or the like. As one example, the syndrome input node 702A is or includes at least one serial or parallel communication line among multiple communication lines of a communication interface.

The first syndrome calculation cell 710 is operatively coupled to the syndrome input node 702A and the first output node 716, and is operable to generate a first syndrome associated with the first input. The first syndrome calculation cell 710 can include a first latch block 712, a first parity block 714, and a first output node 716. The first latch block 712 can include one or more logical devices and can selectively couple the syndrome input node 702A to the parity block 714. As one example, the logical devices associated with the first latch block can include a flip-flop, D, flip=flop, or the like, but is not limited thereto. The first parity block 714 can include one or more logical devices and can generate at least one syndrome associated with the first input provided by the syndrome input node 702A, in accordance with a parity matrix operation. The parity matrix operation can be incorporated into the parity block by the logical devices included therein, which can include but are not limited to gate arrays, microcontrollers, and the like. The first output node 716 is operatively coupled to the first latch block 712 and can output a syndrome generated therefrom.

The parity block 714 can generate a syndrome, as defined in Expression (7), where S can be a syndrome vector, H can be a parity matrix, and c can be a vector of erroneous codeword bits. A parity check matrix, can be defined as in Expression (8). The parity block structure of syndrome generator 700 thus allows generation of error correction syndromes for both 3-bit code components and 2-bit code components by substantially reusing parity blocks 714 and 724 for both calculation of 3-bit code components, in state 700A and 2-bit code components, in state 700B. Thus, a parity check matrix H, where can be:

$$S = Hc \qquad (7)$$

$$H = \begin{bmatrix} 1 & \alpha & \alpha^2 & \dots & \alpha^{n-1} \\ \dots & \alpha^2 & (\alpha^2)^2 & \dots & (\alpha^2)^{n-1} \\ \dots & & & & \dots \\ \dots & & & & \dots \\ 1 & \alpha^{2t} & (\alpha^{2t})^2 & \dots & (\alpha^{2t})^{n-1} \end{bmatrix} \qquad (8)$$

The second syndrome calculation cell 720 is operatively coupled to the syndrome input node 702A and the second output node 726, and is operable to generate a second syndrome associated with the first input. The second syndrome calculation cell 720 can include a second latch block 722, a second parity block 724, and a second output node 726. The second latch block 722, the second parity block 724, and the second output node 726 can each correspond respectively to the first latch block 712, the first parity block 714, and the first output node 716 in at least one of structure and operation. The second parity block 424 can generate a syndrome complementary to, supplementary to, or the like, the syndrome generated at the first parity block 714.

The third syndrome calculation cell in the active state 730A is operatively coupled to the syndrome input node 702A and the third output node 736A, and is operable to generate a third syndrome associated with the first input. The third syndrome calculation cell 730A can include a third latch block in an active state 732A, a third parity block in an active state 734A, and a third output node in an active state 736A. The third latch block 732, the third parity block 734, and the third output node 736 can each correspond respectively to the first latch block 712, the first parity block 714, and the first output node 716 in at least one of structure and operation. The third parity block 434 can generate a syndrome complementary to, supplementary to, or the like, one or more of the syndromes respectively generated at the first parity block 714 and the second parity block 724.

Figure 7B:
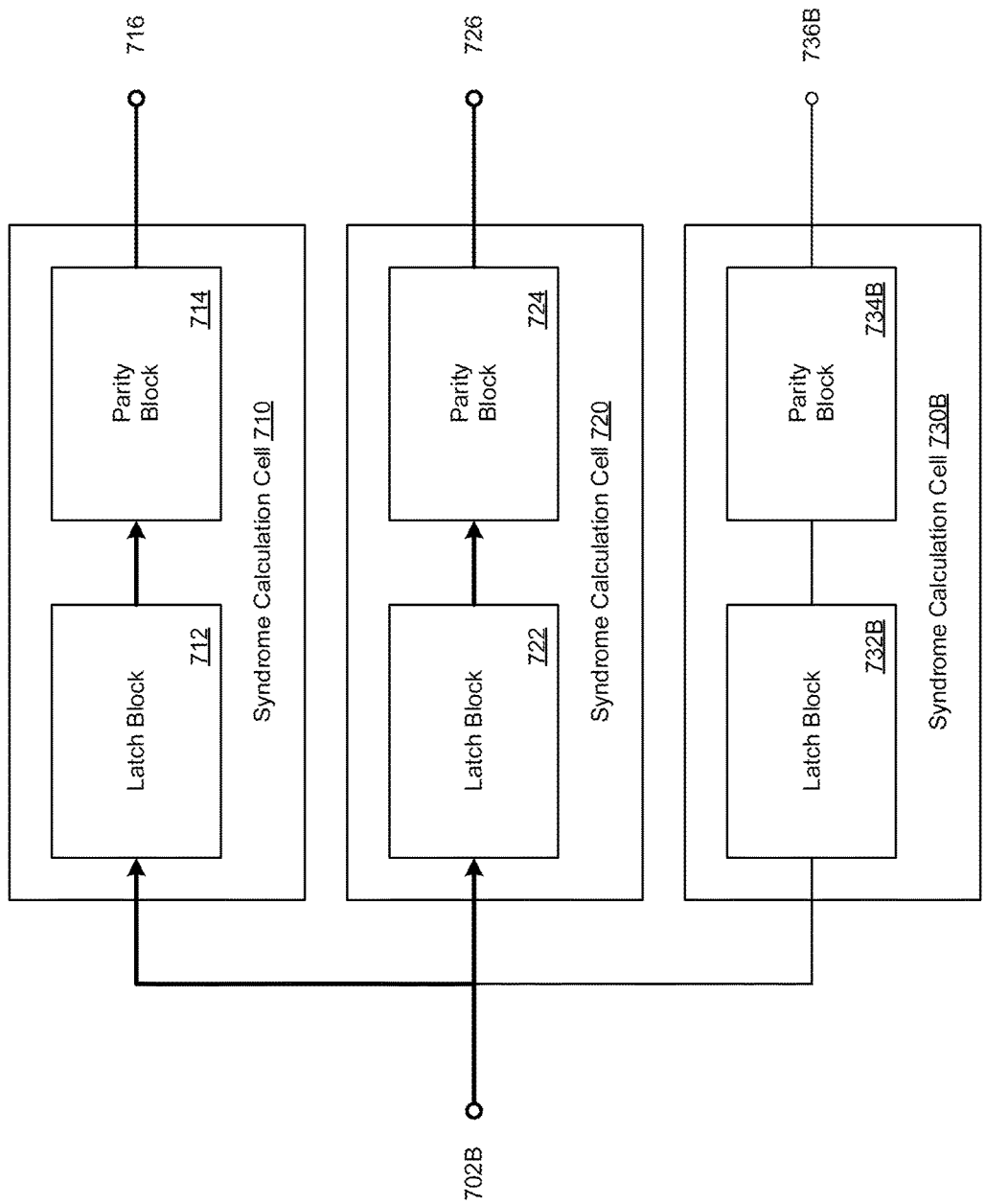
FIG. 7B illustrates an example memory device error correction syndrome generator in a second state corresponding to a second code component type further to the example syndrome generator of FIG. 7A.

FIG. 7B illustrates an example memory device error correction syndrome generator in a second state corresponding to a second code component type further to the example syndrome generator of FIG. 7A. As illustrated by way of example in FIG. 7B, an example syndrome generator in a second state 700B includes the syndrome input node receiving a second input 702B, the first syndrome calculation cell the active state 710, the second syndrome calculation cell the active state 720, and the third syndrome calculation cell in an inactive state 730B.

The syndrome input node receiving a second input 702B can receive an inactive, null or like input. Alternatively, the syndrome input node 702B can provide an input corresponding to the first input, which can then be blocked at the latch block 732B from reaching the parity block 734B. In some implementations, the syndrome input node 702B corresponds in one or more of structure and operation to the syndrome input node 702A.

The third syndrome calculation cell in an inactive state 730B can be inactive and block, generation of a syndrome for a code component not associated with the third syndrome calculation cell. As one example, the third syndrome calculation cell 730B can be in the inactive state during syndrome calculation of a 2-bit code component. Thus, the third syndrome calculation cell 730 can be selectively activated to calculate a syndrome for a code component associated therewith. The third syndrome calculation cell 730A can include the third latch block in an inactive state 732B, the third parity block in an inactive state 734B, and the third output node in an inactive state 736B. In the inactive state, none of the third latch block 732B, the third parity block 734B, and the third output node 736B. In some implementations, one or more blocks of the syndrome generator 700 include one or more logical or electronic devices including but not limited to integrated circuits, logic gates, flip flops, gate arrays, programmable gate arrays, and the like. It is to be understood that any electrical, electronic, or like devices, or components associated with the syndrome generator 700 can also be associated with, integrated with, integrable with, replaced by, supplemented by, complemented by, or the like, the non-volatile memory device 100 or the host 101, or any component thereof.

Figure 8:
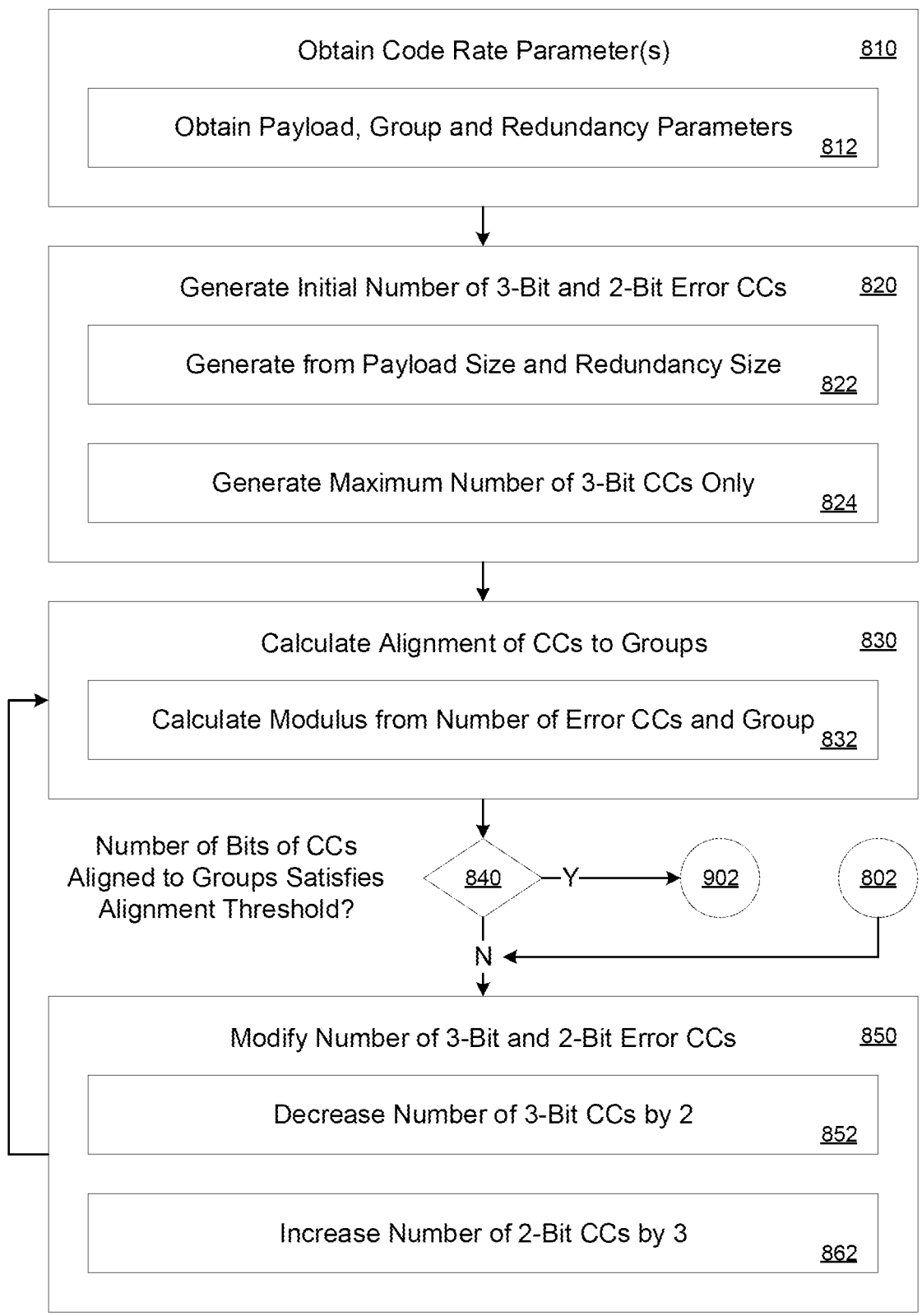
FIG. 8 illustrates a second example method of optimizing irregular error correction code components in memory devices, in accordance with present implementations.

FIG. 8 illustrates a second example method of optimizing irregular error correction code components in memory devices, in accordance with present implementations. In some implementations, at least one of the non-volatile storage device 100 and the host 101 performs method 800 according to present implementations. In some implementations, the method 800 begins at 810.

At 810, the example system obtains one or more code rate parameters. In some implementations, 810 includes 812. At 812, the example system obtains one or more of a payload size parameter, a group size parameter, and a redundancy parameter. The method 800 then continues to 820.

At 820, the example system generates at least one of an initial 3-bit code component block and an initial 2-bit code component block. A code component block can correspond to a code construction independent of a particular memory device, payload bit mapping or the like. The code component block can be efficiently analyzed and modified in multiple stages before mapping to payload bits associated with a particular memory device, in order to more rapidly generate a code component while minimizing payload mapping steps during an optimization process, validation process, and the like as discussed herein. Then, in subsequent stages, the code component block can be mapped to payload bits of a memory device for further analysis, modification, verification, and the like. In some implementations, 820 includes at least one of 822 and 824. At 822, the example system generates the code component blocks based at least partially on the payload size parameters and the redundancy parameter. At 824, the example system generates only a maximum number of 3-bit code component blocks. The method 800 then continues to 830.

At 830, the example system calculates an alignment of code component blocks to the group size parameter. Alignment of code components can be associated with a with a particular numerical relationship between the number of bits associated with one or more code components in the aggregate, and the number of bits associated with the group size parameter. As one example, alignment calculation can generate a number of unused bits, "wasted" bits, or the like, with respect to the number of bits associated with the code component blocks and the group size parameter. In some implementations, 830 includes 832. At 832, the example system calculates a modulus of a number of generated code component blocks and a group size parameter. The modulus can indicate the number of used bits, "wasted" bits, or the like, with respect to the generated set of 3-bit code component blocks and the 2-bit code component blocks. The method 800 then continues to 840.

At 840, the example system determines whether the number of bits associated with the component blocks and aligned to the group size parameter satisfies an alignment threshold. In accordance with a determination that the number of bits associated with the component blocks and aligned to the group size parameter satisfies the alignment threshold, the method 800 continues to 902. Alternatively, in accordance with a determination that the number of bits associated with the component blocks and aligned to the group size parameter does not satisfy the alignment threshold, the method 800 continues to 850.

At 850, the example system modifies the number of 3-bit code component blocks and 2-bit code component blocks. In some implementations, 850 includes at least one of 852 and 854. At 852, the example system decreases the number of 3-bit code components by a predetermined number. As one example, the predetermined number can be three, corresponding to increasing by three the number of 3-bit code component blocks. At 854, the example system increases the number of 2-bit code components by a predetermined number. As one example, the predetermined number can be two, corresponding to increasing by two the number of 2-bit code component blocks. The method 800 then continues to 830.

Figure 9:
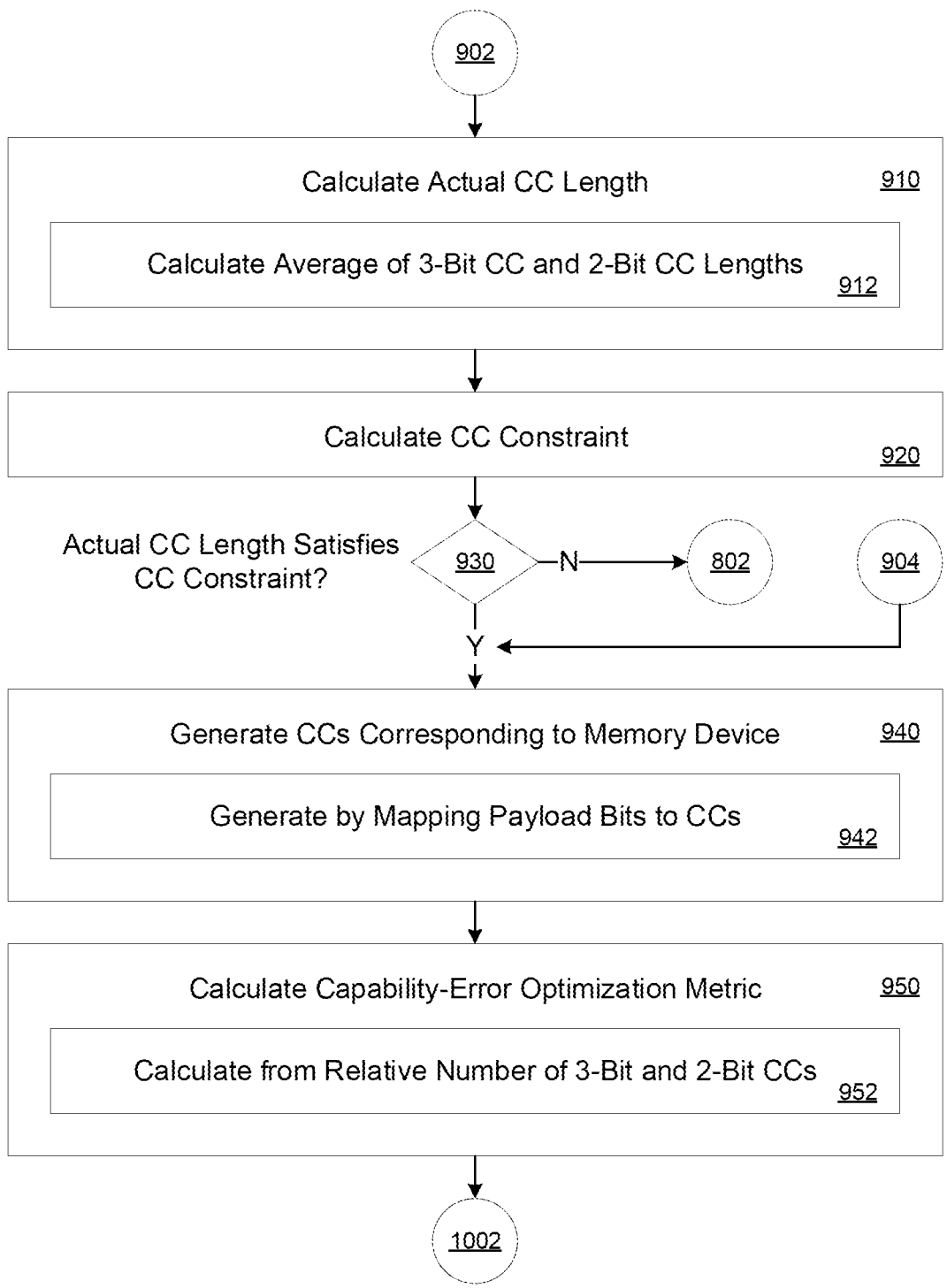
FIG. 9 illustrates a second example method of optimizing irregular error correction code components in memory devices further to the example method of FIG. 8.

FIG. 9 illustrates a second example method of optimizing irregular error correction code components in memory devices further to the example method of FIG. 8. In some implementations, at least one of the non-volatile storage device 100 and the host 101 performs method 900 according to present implementations. In some implementations, the method 900 begins at 902. The method 900 then continues to 910.

At 910, the example system calculates an actual aggregate code component block length. In some implementations, 910 includes 912. At 912, the example system calculates an average length based on one or more of the number of 3-bit code component blocks, the number of 2-bit code component blocks, the length of each 3-bit code component block, and the length of each 2-bit code component block. As one example, the average can be an arithmetic mean derived from the number of 3-bit code component blocks, the number of 2-bit code component blocks, the length of each 3-bit code component block, and the length of each 2-bit code component block. The method 900 then continues to 920.

At 920, the example system calculates a code component length constraint. The code component length constraint can correspond to the code rate constraint 2Q as discussed above. The method 900 then continues to 930.

At 930, the example system determines whether the actual aggregate code component block length satisfies the code component constraint. In accordance with a determination that the actual aggregate code component block length satisfies the code component constraint, the method 900 continues to 940. Alternatively, in accordance with a determination that the actual aggregate code component block length does not satisfy the code component constraint, the method 900 continues to 802. At 802, the method 800 continues to 850.

At 940, the example system generates one or more code components corresponding to a memory device. The generated code components can correspond to, but are not limited to, one or more of the code structures of FIG. 6 and Tables 1-3 as discussed above. In some implementations, 940 includes 942. At 942, the example system generates the code components by mapping payload bits associated with the memory device to one or more code components. The method 900 then continues to 950.

At 950, the example system calculates an optimization metric based on a capability characteristic and an error characteristic associated with the code components. The optimization metric can be generated based on, but is not limited to, the optimization in accordance with Table 3. In some implementations, 950 includes 952. At 952, the example system calculates the optimization metric based on one or more of a number of 3-bit code components, a number of 2-bit code components, and a relative number of 3-bit code components and 2-bit code components. The method 900 then continues to 1002.

Figure 10:
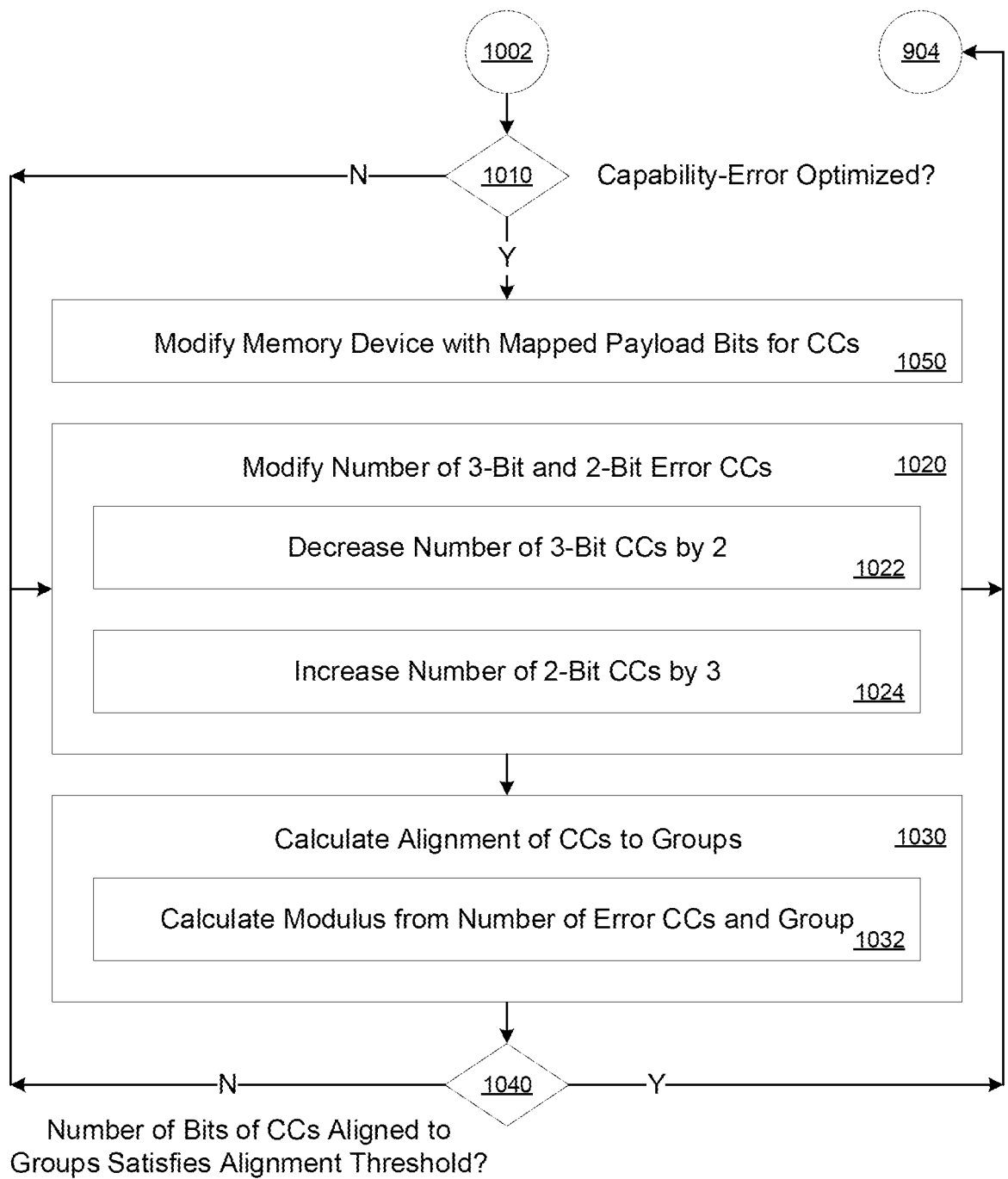
FIG. 10 illustrates a second example method of optimizing irregular error correction code components in memory devices further to the example method of FIG. 9.

FIG. 10 illustrates a second example method of optimizing irregular error correction code components in memory devices further to the example method of FIG. 9. In some implementations, at least one of the non-volatile storage device 100 and the host 101 performs method 1000 according to present implementations. In some implementations, the method 1000 begins at 1002. The method 1000 then continues to 1010.

At 1010, the example system determines whether the optimization metric satisfies an error optimization threshold. The error optimization threshold can be manually settable in accordance with performance requirements of a particular memory device or a particular application of a particular memory device. The error optimization threshold can generate a balance between a maximum desired error floor and minimum desired error correction capability, by, for example, iterating through various combinations of 3-bit code components and 2-bit code components at a particular code rate until one or more of the capability and error floor criteria are satisfied. In accordance with a determination that the optimization metric satisfies the error optimization threshold, the method 1000 continues to 1050. Alternatively, in accordance with a determination that the optimization metric does not satisfy an error optimization threshold, the method 1000 continues to 1020.

At 1020, the example system modifies the number of 3-bit code component blocks and 2-bit code component blocks. The balance of 3-bit and 2-bit code components can be iteratively modified at compile-time or run-time to achieve the predetermined optimization, in accordance with an optimization threshold, and can be repeating mapped to payload bits of hardware device iteratively to further validate the code construction. 1020 can correspond at least partially to 820. In some implementations, 1020 includes at least one of 1022 and 1024. At 1022, the example system decreases the number of 3-bit code components by a predetermined number. As one example, the predetermined number can be three, corresponding to increasing by three the number of 3-bit code component blocks. At 1024, the example system increases the number of 2-bit code components by a predetermined number. As one example, the predetermined number can be two, corresponding to increasing by two the number of 2-bit code component blocks. The method 1000 then continues to 1030.

At 1030, the example system calculates an alignment of code component blocks to the group size parameter. 1020 can correspond at least partially to 830. In some implementations, 1030 includes 1032. At 1032, the example system calculates a modulus of a number of generated code component blocks and a group size parameter. The modulus can indicate the number of used bits, "wasted" bits, or the like, with respect to the generated set of 3-bit code component blocks and the 2-bit code component blocks. The method 1000 then continues to 1040.

At 1040, the example system determines whether the number of bits associated with the component blocks and aligned to the group size parameter satisfies an alignment threshold. In accordance with a determination that the number of bits associated with the component blocks and aligned to the group size parameter satisfies the alignment threshold, the method 1000 continues to 904. At 904, the method 900 continues to 940. Alternatively, in accordance with a determination that the number of bits associated with the component blocks and aligned to the group size parameter does not satisfy the alignment threshold, the method 1000 continues to 1020.

At 1050, the example system modifies a memory device with one or more of the mapped payload bits associated with one or more of the 3-bit code components and the 2-bit code components. In some implementations, the method 1000 ends at 1050.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. An error correction system, comprising:
   a first syndrome calculation cell operable to receive a first code component input and to generate a first error correction syndrome output corresponding to the first code component input; and
   a second syndrome calculation cell operable to receive the first code component input and to generate a second error correction syndrome output corresponding to the first code component input,
   wherein the first syndrome calculation cell and the second syndrome calculation cell are both configured to generate error correction syndrome outputs corresponding to code component inputs having both a first number of bits and a second different number of bits.

2. The error correction system of claim 1, further comprising:
   a third syndrome calculation cell operable to receive a second code component input and to generate a third error correction syndrome output corresponding to the second code component input.

3. The error correction system of claim 2, wherein the first code component input is associated with a first error correction capability, and the second code component input is associated with a second error correction capability.

4. The error correction system of claim 2, wherein the first code component input comprises a first number of bits, and the second code component comprises a second different number of bits.

5. The error correction system of claim 1, further comprising an interleaver configured to map input bits into a matrix.

6. The error correction system of claim 5, wherein the matrix comprises a pseudo triangular matrix.

7. The error correction system of claim 5, wherein the interleaver comprises a half folded product code (HFPC) interleaver.

8. The error correction system of claim 2, further comprising an encoder for encoding a first component code corresponding to the first component code input and a second component code corresponding to the second component code input.

9. The error correction system of claim 8, wherein the encoder performs folded encoding of the first and second component codes.

10. The error correction system of claim 8, wherein the encoder comprises a Bose-Chaudhuri-Hocquenghem (BCH) encoder.

11. An error correction system comprising:
a first syndrome calculation cell operable to receive a first code component input and to generate a first error correction syndrome output corresponding to the first code component input; and
a second syndrome calculation cell operable to receive the first code component input and to generate a second error correction syndrome output corresponding to the first code component input,
wherein the first syndrome calculation cell and the second syndrome calculation cell each comprise a latch block and a parity block.

12. The error correction system of claim 11, wherein the parity block implements a parity matrix operation.

13. The error correction system of claim 11, wherein the parity block of the second syndrome calculation cell generates a second syndrome that is complementary to a first syndrome generated by the first syndrome calculation cell.

14. An error correction, comprising:
a first syndrome calculation cell operable to receive a first code component input and to generate a first error correction syndrome output corresponding to the first code component input;
a second syndrome calculation cell operable to receive the first code component input and to generate a second error correction syndrome output corresponding to the first code component input; and
a third syndrome calculation cell operable to receive a second code component input and to generate a third error correction syndrome output corresponding to the second code component input,
wherein the first syndrome calculation cell is operable to receive the second code component input and to generate a fourth error correction syndrome output corresponding to the first code component input, and the second syndrome calculation cell is operable to receive the second code component input and to generate a fifth error correction syndrome output corresponding to the second code component input.

15. The error correction system of claim 14, wherein the first syndrome calculation cell includes a parity block operable to generate an error correction output in accordance with a parity check matrix corresponding to code rate parameters.

16. The error correction system of claim 15, wherein the code rate parameters include one or more of a payload size parameter, a group size parameter, and a A redundancy parameter.

17. The error correction system of claim 16, wherein first code component blocks and second code component blocks are aligned to the group size parameter.

18. The error correction system of claim 16, wherein first code component blocks and second code component blocks are aligned to a code component length constraint.

19. The error correction system of claim 18, wherein the first code component blocks and the second code component blocks comprise half-folded product code (HFPC) code component blocks.

* * * * *